US012796091B2

(12) United States Patent
Xu et al.

(10) Patent No.: US 12,796,091 B2
(45) Date of Patent: Nov. 10, 2026

(54) DISPLAY SUBSTRATE AND DISPLAY DEVICE INCLUDING ANODE CONNECTION LINE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yuanjie Xu, Beijing (CN); Weiyun Huang, Beijing (CN); Lili Du, Beijing (CN); Yanwei Lu, Beijing (CN); Qiwei Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 582 days.

(21) Appl. No.: 18/275,041

(22) PCT Filed: Apr. 27, 2022

(86) PCT No.: PCT/CN2022/089553

§ 371 (c)(1),
(2) Date: Jul. 31, 2023

(87) PCT Pub. No.: WO2023/206138

PCT Pub. Date: Nov. 2, 2023

(65) Prior Publication Data

US 2025/0006747 A1 Jan. 2, 2025

(51) Int. Cl.

| | |
|---|---|
| ***H10D 86/60*** | (2025.01) |
| ***H10D 86/40*** | (2025.01) |
| ***H10W 90/00*** | (2026.01) |

(52) U.S. Cl.
CPC .......... *H10D 86/60* (2025.01); *H10D 86/441* (2025.01); *H10W 90/00* (2026.01)

(58) Field of Classification Search
CPC ..... H10D 86/60; H10D 86/441; H10W 90/00; H01L 25/167; G09F 9/30; G09G 3/32
See application file for complete search history.

(56) References Cited

U.S. PATENT DOCUMENTS 9,613,558 B2 * 4/2017 Chen ........................ G06T 5/70
9,851,597 B2 * 12/2017 Park ................. G02F 1/133512
(Continued)

FOREIGN PATENT DOCUMENTS

CN 111883565 A 11/2020
CN 112117320 A 12/2020
(Continued)

*Primary Examiner* — Caleb E Henry
(74) *Attorney, Agent, or Firm* — Scully, Scott, Murphy & Presser, P.C.

(57) ABSTRACT

A display substrate and a display device. The display substrate a base substrate and a first display region, a second display region and N anode connection lines on the base substrate; the first display region includes M first pixel driving circuits, M first connection holes, N second pixel driving circuits, and N second connection holes, the second display region includes N anode connection holes; N anode connection lines connect the N second connection holes with the N anode connection holes; the N anode connection holes form a plurality of anode connection hole rows along a third direction, a plurality of the anode connection holes in each of the anode connection hole rows are arranged along the third direction, the plurality of the anode connection hole rows are arranged along a direction perpendicular to the third direction.

20 Claims, 5 Drawing Sheets

10

(56) References Cited

U.S. PATENT DOCUMENTS

| | | | | |
|---|---|---|---|---|
| 12,052,900 | B2 * | 7/2024 | Kim | H10K 59/352 |
| 2002/0121639 | A1 * | 9/2002 | So | H10D 30/0314<br>257/E29.147 |
| 2017/0108976 | A1 * | 4/2017 | Ding | G09G 3/36 |
| 2018/0089485 | A1 * | 3/2018 | Bok | G06F 1/1684 |
| 2019/0265478 | A1 * | 8/2019 | Cok | G02B 27/0172 |
| 2020/0013986 | A1 * | 1/2020 | Li | H10K 59/124 |
| 2020/0176696 | A1 * | 6/2020 | Dai | H10K 59/131 |
| 2021/0074778 | A1 * | 3/2021 | Li | G02F 1/16756 |
| 2022/0392963 | A1 * | 12/2022 | Chen | G09G 3/20 |

FOREIGN PATENT DOCUMENTS

| | | | |
|---|---|---|---|
| CN | 112466209 | A | 3/2021 |
| CN | 112928149 | A | 6/2021 |
| CN | 113097283 | A | 7/2021 |
| CN | 113421906 | A | 9/2021 |
| CN | 113990909 | A | 1/2022 |
| EP | 4203051 | A1 | 6/2023 |
| JP | 2008233606 | A | 10/2008 |
| JP | 2019128554 | A | 8/2019 |
| JP | 2019135514 | A | 8/2019 |

* cited by examiner

DISPLAY SUBSTRATE AND DISPLAY DEVICE INCLUDING ANODE CONNECTION LINE

CROSS-REFERENCE TO RELATED APPLICATION

This application is a U.S. National Phase of International Application No. PCT/CN2022/089553, filed on Apr. 27, 2022, the entire disclosure of which is incorporated herein by reference as part of the present application.

TECHNICAL FIELD

At least one embodiment of the present disclosure relates to a display substrate and a display device.

BACKGROUND

With the continuous development of display technology, organic Light-emitting Diode (OLED) display technology has been increasingly used in various electronic products due to its advantages such as self-illumination, wide viewing angle, high contrast ratio, low power consumption, and high response speed.

On the other hand, people have higher and higher requirements for the screen-to-body ratio of display devices such as smartphones and tablet computers. A design of arranging some functional components of these display devices under their screen has become a new research hotspot. For example, an under-screen camera design achieves an ultra-high screen-to-body ratio by placing a camera of the display device under its screen. In the display device designed with the under-screen camera, because the camera needs light to pass through the screen, the screen needs to be provided with a transparent display region that can both display and allow light to pass through.

SUMMARY

At least one embodiment of the present disclosure provides a display substrate and a display device. In the display substrate, a plurality of anode connection hole rows are formed by arranging N anode connection holes along a third direction, anode connection lines can be routed between adjacent anode connection hole rows, so that a diameter of a second display region can be increased to increase an area of the second display region. Moreover, because the anode connection lines can be routed along the third direction, there is no need for ladder-shaped routing, so that lengths of the anode connection lines can be reduced. On the other hand, because the anode connection lines can be routed along the third direction, interference or diffraction phenomenon with structures extending along the first direction or the second direction on the display substrate can also be avoided, and mura defects can be avoided, and display quality can be improved.

At least one embodiment of the present disclosure provides a display substrate, which includes: a base substrate; a first display region, located on the base substrate, and comprising M first pixel driving circuits, M first connection holes, N second pixel driving circuits, and N second connection holes; a second display region, located on the base substrate, and comprising N anode connection holes; and N anode connection lines, connecting the N second connection holes with the N anode connection holes, the second display region is configured to allow light to pass through, the M first connection holes are arranged in one-to-one correspondence with the M first pixel driving circuits, each of the first connection holes is configured to be electrically connected to an output end of a corresponding first pixel driving circuit, the N second connection holes are arranged in one-to-one correspondence with the N second pixel driving circuits, each of the second connection holes is configured to be electrically connected to an output end of a corresponding second pixel driving circuit; the M first pixel driving circuits and the N second pixel driving circuits are arranged in an array on the base substrate, and form pixel driving rows extending along a first direction, a plurality of pixel driving rows are arranged along a second direction intersecting with the first direction; the N anode connection holes form a plurality of anode connection hole rows along a third direction, a plurality of the anode connection holes in each of the anode connection hole rows are arranged along the third direction, the plurality of the anode connection hole rows are arranged along a direction perpendicular to the third direction, an included angle between the third direction and the first direction is less than 90 degrees, and both M and N are positive integers greater than or equal to 2.

For example, in the display substrate provided by an embodiment of the present disclosure, a plurality of the anode connection holes in each of the anode connection hole rows are located on a virtual straight line extending along the third direction.

For example, in the display substrate provided by an embodiment of the present disclosure, a value range of an included angle between the third direction and the first direction is from 30 degrees to 60 degrees.

For example, in the display substrate provided by an embodiment of the present disclosure, each of the anode connection lines comprises a first sub-connection line, the first sub-connection line is located between two adjacent ones of the anode connection hole rows, and extends along the third direction.

For example, in the display substrate provided by an embodiment of the present disclosure, at least 6 of the first sub-connection lines are arranged between the two adjacent ones of the anode connection hole rows.

For example, in the display substrate provided by an embodiment of the present disclosure, the M first connection holes and the N second connection holes form a plurality of connection hole rows along a fourth direction, a plurality of first connection holes and at least one of the second connection holes in each of the connection hole rows are arranged along the fourth direction, the plurality of connection hole rows are arranged along a direction perpendicular to the fourth direction, an included angle between the fourth direction and the first direction is less than 90 degrees.

For example, in the display substrate provided by an embodiment of the present disclosure, the plurality of first connection holes and the at least one of the second connection holes in each of the connection hole rows are located on a virtual straight line extending along the fourth direction.

For example, in the display substrate provided by an embodiment of the present disclosure, the included angle between the third direction and the first direction is greater than the included angle between the fourth direction and the first direction.

For example, in the display substrate provided by an embodiment of the present disclosure, a value range of the included angle between the fourth direction and the first direction is from 15 degrees to 30 degrees.

For example, in the display substrate provided by an embodiment of the present disclosure, each of the anode connection lines comprises a second sub-connection line, the second sub-connection line is electrically connected with the first sub-connection line, the second sub-connection line is located between two adjacent ones of the connection hole rows, and extends along the fourth direction.

For example, in the display substrate provided by an embodiment of the present disclosure, at least 6 of the second sub-connection lines are arranged between two adjacent ones of the connection hole rows.

For example, in the display substrate provided by an embodiment of the present disclosure, the first display region comprises a plurality of sub-driving regions arranged in an array along the first direction and the second direction, a first spacer is provided between two adjacent sub-driving regions in the first direction, and a second spacer is provided between two adjacent sub-driving regions in the second direction, each of the anode connection lines comprises a third sub-connection line, the third sub-connection line is electrically connected with the first sub-connection line, and is located in the first spacer or the second spacer.

For example, in the display substrate provided by an embodiment of the present disclosure, each of the sub-driving regions comprises a plurality of first pixel driving circuits and a plurality of second pixel driving circuits, a size of the first spacer in the first direction is greater than a distance between adjacent first pixel driving circuits in the sub-driving region, a size of the second spacer in the second direction is greater than a distance between adjacent first pixel driving circuits in the sub-driving region.

For example, in the display substrate provided by an embodiment of the present disclosure, the display substrate further includes: a pixel driving layer, located on the base substrate; and a plurality of planarization layers, located on a side of the pixel driving layer away from the base substrate, the first pixel driving circuits and the second pixel driving circuits are located in the pixel driving layer, the first connection holes and the second connection holes at least penetrate through one of the plurality of planarization layers that is closest to the pixel driving layer.

For example, in the display substrate provided by an embodiment of the present disclosure, the display substrate further includes at least one conductive layer between the plurality of the planarization layers, the N anode connection lines are located in the at least one conductive layer.

For example, in the display substrate provided by an embodiment of the present disclosure, the at least one conductive layer comprises a plurality of the conductive layers, the plurality of the conductive layers are sequentially arranged along a direction perpendicular to the base substrate, each of the conductive layers is sandwiched between two of the planarization layers adjacent to each other; a part of the N anode connection lines is located in one conductive layer of the plurality of the conductive layers, and another part of the N anode connection lines is located in another one conductive layer of the plurality of the conductive layers.

For example, in the display substrate provided by an embodiment of the present disclosure, a material of a conductive layer comprises transparent conductive oxide.

For example, in the display substrate provided by an embodiment of the present disclosure, the first display region further comprises M first light-emitting structures, each of the first light-emitting structures comprises a first anode, the M first anodes of the M first light-emitting structures are electrically connected with output ends of the M first pixel driving circuits through the M first connection holes; and the second display region further comprises N second light-emitting structures, each of the second light-emitting structures comprises a second anode, the N second anodes of the N second light-emitting structures are electrically connected with output ends of the N second pixel driving circuits through the N anode connection holes, the N anode connection lines and the N second connection holes.

For example, in the display substrate provided by an embodiment of the present disclosure, each of the first light-emitting structures comprises a first light-emitting functional layer and a first cathode, the first light-emitting functional layer is located on a side of the first anode away from the base substrate, the first cathode is located on a side of the first light-emitting functional layer away from the first anode, each of the second light-emitting structures comprises a second light-emitting functional layer and a second cathode, the second light-emitting functional layer is located on a side of the second anode away from the base substrate, and the second cathode is located on a side of the second light-emitting functional layer away from the second anode.

At least one embodiment of the present disclosure further provides a display device, comprising any one of the above-mentioned display substrate.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1:
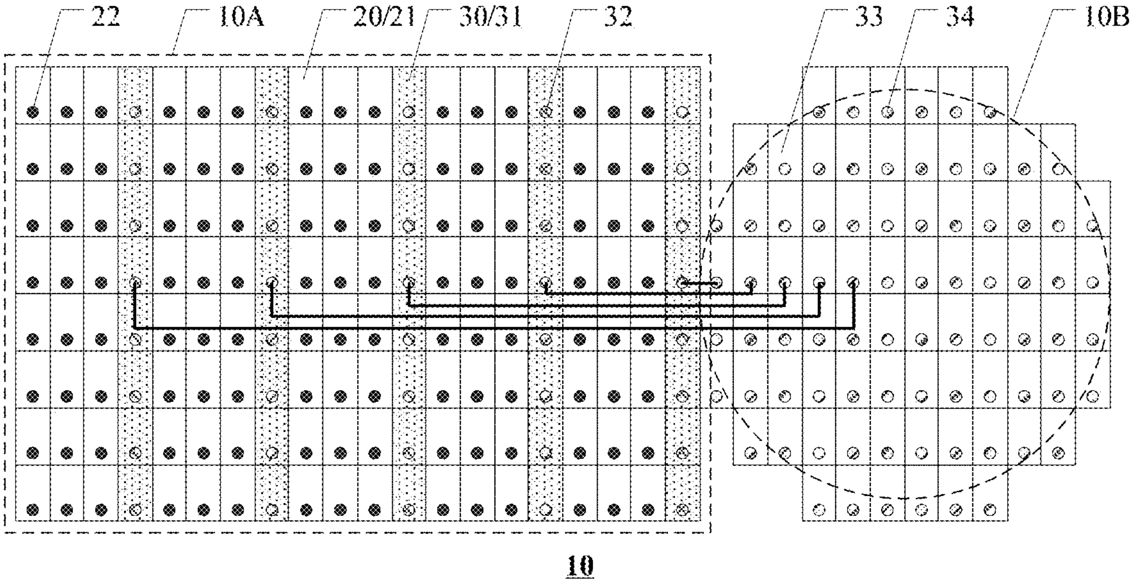
FIG. 1 is a planar schematic diagram of a display substrate.

In order to make objectives, technical details, and advantages of the embodiments of the present disclosure clearer, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms “comprise.” “comprising.” “include.” “including,” etc., are intended to specify that the elements or the objects stated before these terms encompass the elements or the objects and equivalents thereof listed after these terms, but do not preclude the other elements or objects. The phrases “connect”, “connected”, etc., are not intended to define a physical connection or mechanical connection, but may include an electrical connection, directly or indirectly.

Unless otherwise defined, features such as “parallel”, “perpendicular” and “same” used in the embodiments of the present disclosure all include situations such as “parallel”, “perpendicular”, and “same” in the strict sense, and also include situations such as “approximately parallel”, “approximately perpendicular”, “approximately the same” that contain certain errors. For example, the above “approximately” may mean that difference of compared objects is within 10% of an average value of the compared objects, or within 5% of an average value of the compared objects. In a case that a number of components or elements is not specifically indicated below in the embodiments of the present disclosure, it refers to that the components or elements may be one or more, or may be understood as at least one. “At least one” refers to one or more, and “a plurality” refers to at least two. The “arranged on the same layer” in the embodiments of the present disclosure refers to a relationship between a plurality of film layers formed by a same material after going through a same step (for example, an one-step patterning process). The “same layer” here does not always refer to that the plurality of film layers have the same thickness or that the plurality of film layers have the same height in cross-sectional schematic diagrams.

Currently, a display device designed with an under-screen camera includes a transparent display region that can both display and allow light to pass through. However, because pixel driving circuits of the organic light-emitting diode display device are relatively complex, occupy large areas, and are mostly opaque structures, generally no driving circuit is arranged in the transparent display region, and pixel driving circuits of sub-pixels in the transparent display region are arranged in other display regions that do not require light to pass through, then light-emitting structures of the sub-pixels in the transparent display region are connected with the corresponding pixel driving circuits through the anode connection lines, so that the transparent display region can not only display, but also allow light to pass through.

Figure 2:
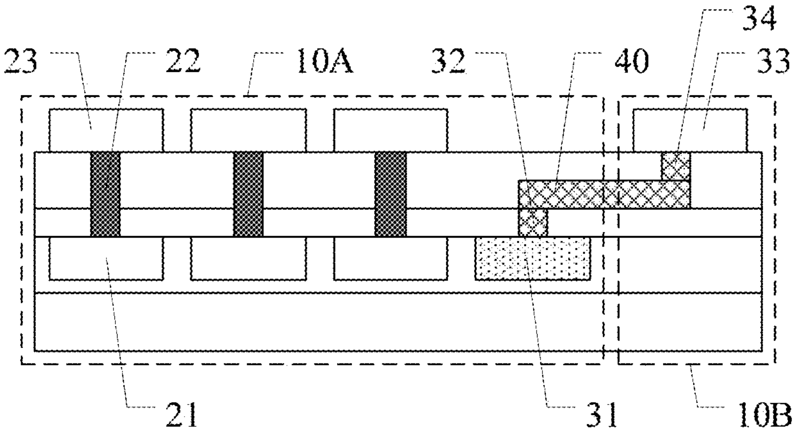
FIG. 2 is a cross-sectional schematic diagram of a display substrate.

FIG. 1 is a planar schematic diagram of a display substrate. FIG. 2 is a cross-sectional schematic diagram of a display substrate. As illustrated by FIG. 1 and FIG. 2, the display substrate 10 includes a normal display region 10A and a transparent display region 10B. The normal display region 10A is arranged with normal sub-pixels 20 and dummy driving units 30; each of the normal sub-pixels 20 includes a pixel driving circuit 21, a first via hole 22 and a light-emitting structure 23 that are stacked, a driving electrode (such as an anode) in the light-emitting structure 23 is electrically connected with the pixel driving circuit 21 through the first via hole 22, so that the pixel driving circuit 21 can apply a driving signal to the light-emitting structure, to drive the light-emitting structure to perform light-emitting display. On the other hand, each of the dummy driving units 30 is only arranged with a pixel driving circuit 31 and a second via hole 32, at the same time, the transparent display region 10B only includes a light-emitting structure 33 and an anode via hole 34, and no pixel driving circuit is arranged. In this way, in the display device 10, the pixel driving circuit 31 in the dummy driving unit 30 can be electrically connected with the light-emitting structure 32 in the transparent display region 10B by setting the anode connection line 40 through the second via hole 32 and the anode via hole 34, so that the pixel driving circuit 31 can drive the corresponding light-emitting structure 32 to perform light-emitting display. Because no pixel driving circuit is arranged in the transparent display region, and the light-emitting structure can be made of transparent materials, the transparent display region can realize a region capable of displaying and allowing light to pass through.

As illustrated by FIG. 1 and FIG. 2, the anode connection lines 40 are routed along a horizontal direction in both the normal display region 10A and the transparent display region 10B; however, in order to prevent the anode connection lines 40 from being connected with a plurality of pixel driving circuits, the anode connection lines 40 cannot be overlapped with a plurality of first via holes 22 at the same time, so that the anode connection lines 40 can only be arranged between adjacent first via holes 22 in the vertical direction, but spaces between the adjacent first via holes 22 in the vertical direction are small, thus a number of the anode connection lines 40 is limited.

As illustrated by FIG. 1, in a case that the anode connection lines 40 arranged at intervals between adjacent first via holes 22 in the vertical direction are restricted, a number of anode via holes 34 with which these anode connection lines 40 are connected is also limited. Because a shape of each of the light-emitting structures 33 (corresponding to the sub-pixels) has a dimension smaller in the lateral direction than a dimension in the vertical direction, a diameter of the transparent display region formed by an arrangement of a limited number of the light-emitting structures 33 in the lateral direction is relatively small. On the other hand, because the anode connection lines 40 are routed along the lateral direction, it is easy to cause optical interference or diffraction with the structures (such as gate lines) extending in the lateral direction on the display substrate 10, so that mura is bad. It should be noted that the transparent display region 10B is usually used to place a camera, so a shape of the transparent display region 10B is usually circular; in addition, the anode connection lines 40 shown in FIG. 1 are only anode connection lines located on a same conductive layer, the display substrate can also be arranged with a plurality of conductive layers, thus the number of the light-emitting structures 33 in the lateral direction of the transparent display region shown in FIG. 1 is greater than the number of light-emitting structures 33 connected with the anode connection lines 34 shown in FIG. 1. In addition, the above-mentioned lateral direction may be a row direction or a column direction of the sub-pixels arranged in an array on the display substrate, the above-mentioned vertical direction is a direction perpendicular to the lateral direction; in addition, the above-mentioned lateral direction may also be an extending direction of the gate lines on the display substrate.

In this regard, embodiments of the present disclosure provide a display substrate and a display device. The display substrate includes a base substrate, a first display region, a second display region and N anode connection lines located on the base substrate; the first display region includes M first pixel driving circuits, M first connection holes, N second pixel driving circuits and N second connection holes; the second display region includes N anode connection holes; the N anode connection lines electrically connect the N second connection holes with the N anode connection holes; the second display region is configured to allow light to pass through, and the M first connection holes are arranged in one-to-one correspondence with the M first pixel driving circuits, each of the first connection holes is configured to be electrically connected with an output end of a corresponding first pixel driving circuit, the N second connection holes are arranged in one-to-one correspondence with the N first pixel driving circuits, each of the second connection holes is configured to be electrically connected with an output end of a corresponding second pixel driving circuit; the M first pixel driving circuits and the N second pixel driving circuits are arranged in an array on the base substrate, and form pixel driving rows extending along the first direction X, a plurality of pixel driving rows are arranged along the second direction Y; the N anode connection holes form a plurality of anode connection hole rows along the third direction D, a plurality of anode connection holes in each of the anode connection hole rows are arranged along the third direction D, the plurality of anode connection hole rows are arranged along a direction perpendicular to the third direction D, and an included angle between the third direction D and the first direction X is less than 90 degrees. In this way, in the display substrate, the plurality of anode connection hole rows are formed by forming N anode connection holes along the third direction D, anode connection lines can be routed between adjacent anode connection hole rows, so that the diameter of the second display region can be increased to increase the area of the second display region. Moreover, because the anode connection lines can be routed along the third direction D, there is no need for ladder-shaped routing, so that the lengths of the anode connection lines can be reduced. On the other hand, because the anode connection lines can be routed along the third direction D, interference or diffraction phenomenon with structures extending along the first direction X or the second direction Y on the display substrate can also be avoided, in turn, the mura defects can be avoided, and the display quality can be improved.

Below, the display substrates and the display devices provided by the embodiments of the present disclosure will be described in detail with reference to the accompanying drawings.

Figure 3:
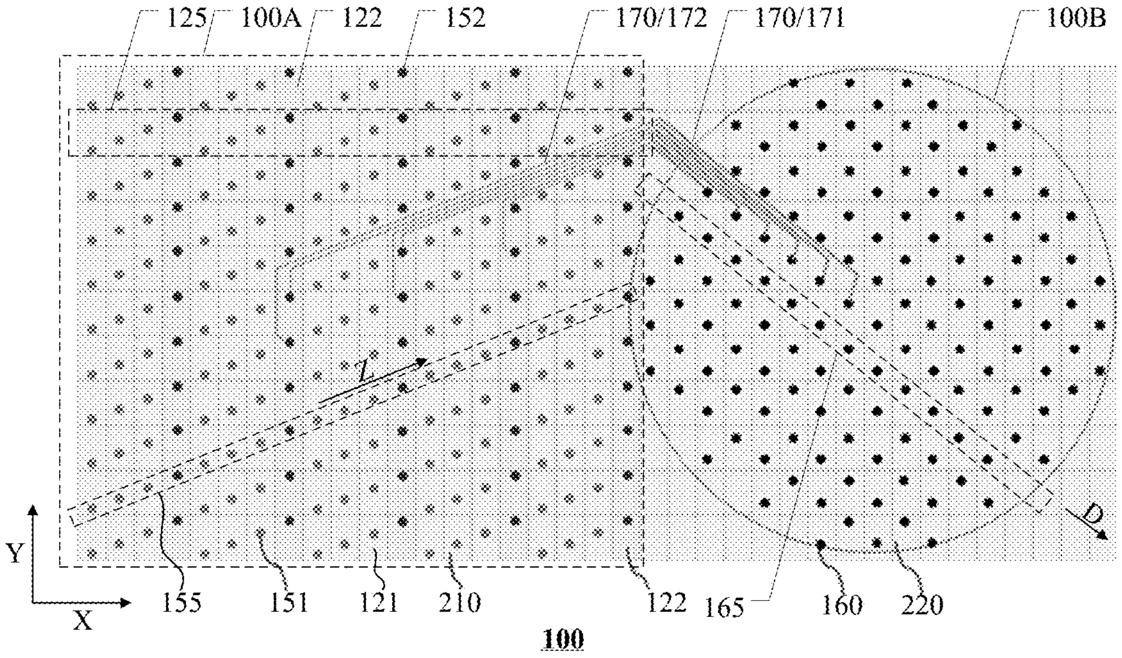
FIG. 3 is a planar schematic diagram of a display substrate provided by an embodiment of the present disclosure.
Figure 4A:
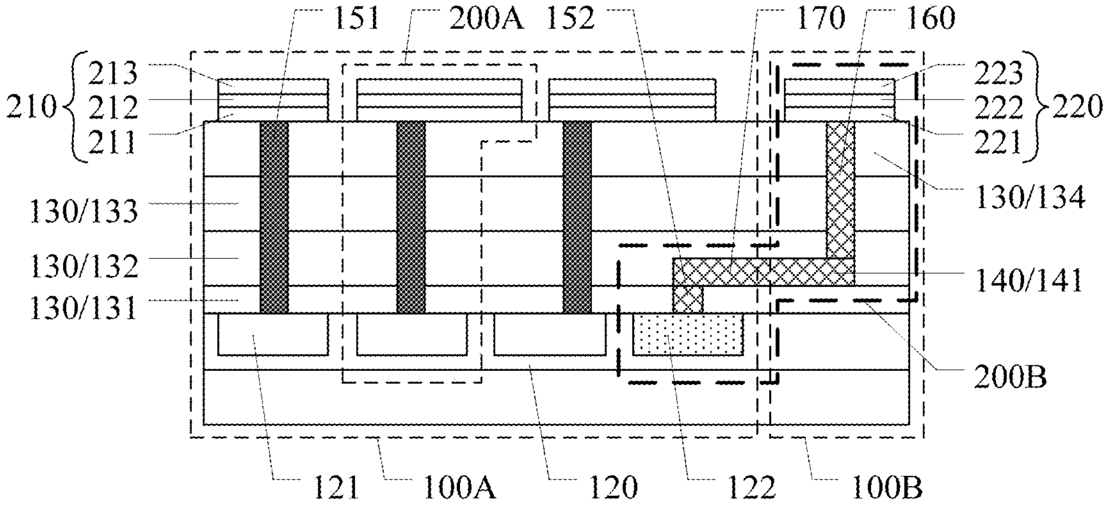
FIGS. 4A to 4C are cross-sectional schematic diagrams of a display substrate provided by an embodiment of the present disclosure.
Figure 4B:
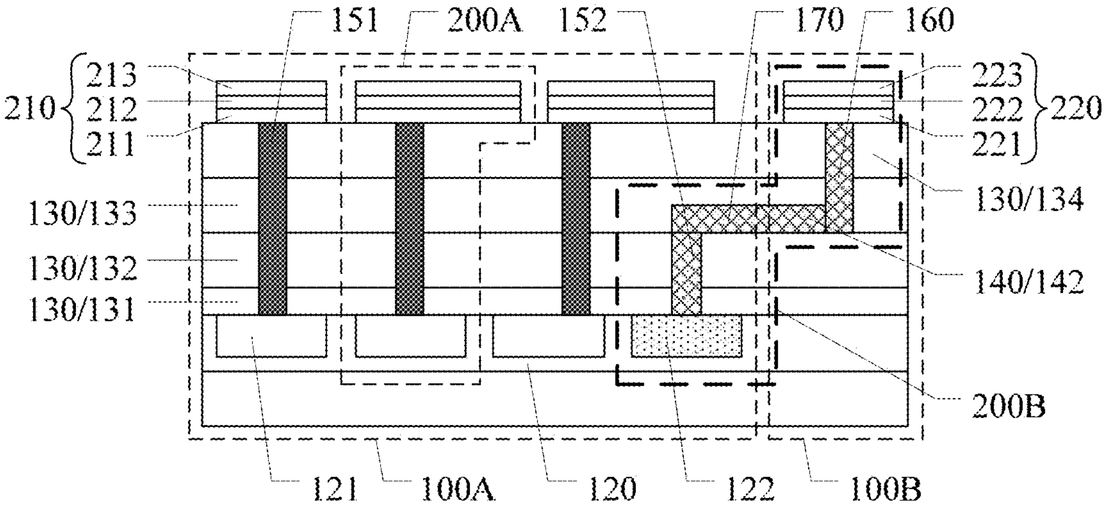
Figure 4C:
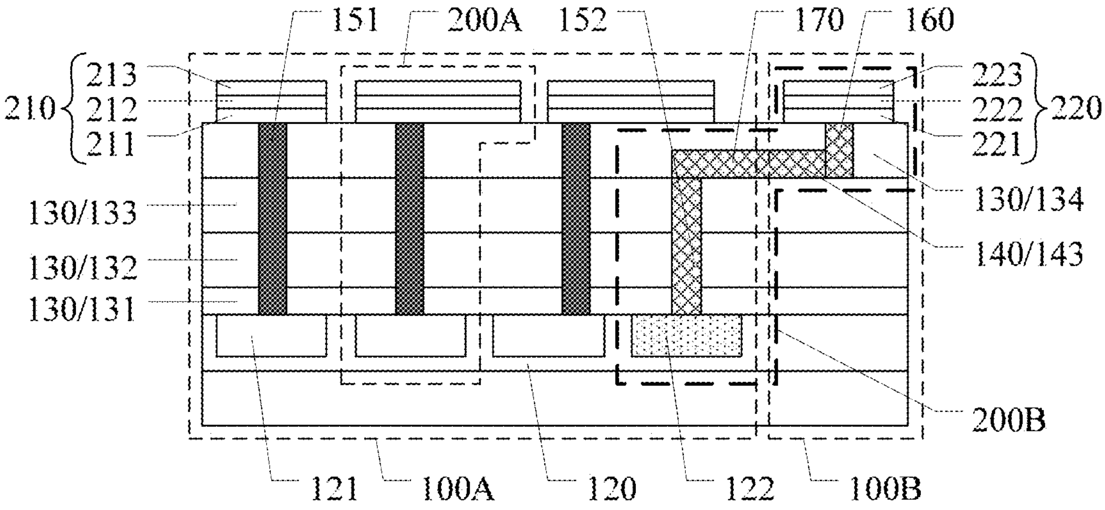

An embodiment of the present disclosure provides a display substrate. FIG. 3 is a planar schematic diagram of a display substrate provided by an embodiment of the present disclosure; FIGS. 4A to 4C are cross-sectional schematic diagrams of a display substrate provided by an embodiment of the present disclosure.

As illustrated by FIG. 3, the display substrate 100 includes a base substrate 110 and a first display region 100A and a second display region 100B located on the base substrate 110; the first display region 100A includes M first pixel driving circuits 121, M first connection holes 151, N second pixel driving circuits 122, and N second connection holes 152; and the second display region 100B includes N anode connection holes 160. At this time, the display substrate 100 further includes N anode connection lines 170, which electrically connect the N second connection holes 152 with the N anode connection holes 160. The second display region 100B is configured to allow light to pass through, that is, the second display region 100B is a transparent display region. The M first connection holes 151 are arranged in one-to-one correspondence with the M first pixel driving circuits 121, each of the first connection holes 151 is configured to be electrically connected with the output end of the corresponding first pixel driving circuit 151, the N second connection holes 152 are arranged in one-to-one correspondence with the N second pixel driving circuits 122, each of the second connection holes 152 is configured to be electrically connected with an output end of the corresponding second pixel driving circuit 122; the M first pixel driving circuits 121 and the N second pixel driving circuits 122 are arranged in an array on the base substrate 110, and pixel driving rows 125 extending along the first direction X are formed, a plurality of pixel driving rows 125 are arranged along a second direction Y intersecting the first direction X. The above M and N are all positive integers greater than or equal to 2; in addition, the above-mentioned first direction and second direction are both directions parallel to a main surface of the base substrate.

It should be noted that the output end of the first pixel driving circuit 121 can be electrically connected with a driving electrode of a light-emitting structure (such as an organic light-emitting diode) through a correspondingly arranged first connection hole 151, so that a driving signal is provided to the driving electrode of the light-emitting structure to drive the light-emitting structure to perform light-emitting display; the output end of the second pixel driving circuit 122 can be electrically connected with the driving electrode of the light-emitting structure through a second connection hole 152, an anode connection line 170 and an anode connection hole 160 that are correspondingly arranged, so that a driving signal is sent to the driving electrode of the light-emitting structure. In addition, the light-emitting structure can be made of transparent or translucent materials, so that at least partial transparency can be achieved. Therefore, the second display region can be arranged with only a light-emitting structure without a pixel driving circuit, to form a transparent display region that can not only display, but also allow light to pass through.

For example, the first direction X and the second direction Y are perpendicular to each other.

As illustrated by FIG. 3, the N anode connection holes 160 form a plurality of anode connection hole rows 165 along a third direction D, a plurality of anode connection holes 160 in each of the anode connection hole rows 165 are arranged along the third direction D, a plurality of anode connection hole rows 165 are arranged along a direction perpendicular to the third direction D, and an included angle between the third direction D and the first direction X is less than 90 degrees. It should be noted that the included angle between the third direction D and the first direction X is less than 90 degrees refers to that the third direction D is a direction inclined at a certain angle relative to the first direction X or the second direction Y, that is, an oblique direction.

In the display substrate provided by the embodiment of the present disclosure, the N anode connection holes form a plurality of anode connection hole rows along the third direction D, thus in the display substrate, the anode connection lines can be routed between adjacent anode connection hole rows. In this case, the light-emitting structures or the sub-pixels connected with the anode connection lines between the adjacent anode connection hole rows are arranged along the third direction D, however, a size of a single light-emitting structure or sub-pixel in the third direction D is significantly larger than a size of a light-emitting structure or a sub-pixel in the first direction X. Therefore, in a case that a number of anode connection lines between adjacent anode connection hole rows is certain, a diameter of the second display region formed by routing the anode connection lines along the third direction D (oblique direction) is significantly larger than a diameter of the second display region formed by routing the anode connection lines along the first direction X. Therefore, the display substrate forms the plurality of anode connection hole rows along the third direction D with the N anode connection holes, the anode connection lines can be routed between adjacent anode connection hole rows, so that the diameter of the second display region can be increased to increase the area of the second display region.

In addition, if the anode connection lines are routed in a ladder shape, the light-emitting structures or the sub-pixels electrically connected with these anode connection lines can also be arranged along an oblique direction to a certain extent, however, this routing method will greatly increase the lengths of the anode connection lines, and the routing method is more complicated. Therefore, the display substrate provided by the embodiments of the present disclosure can also form a plurality of anode connection hole rows by forming N anode connection holes along the third direction D, thus the anode connection lines can be routed along the third direction D without step-shaped routing, so that the lengths of the anode connection lines can be reduced, in this way, under a condition that widths of the anode connection lines remain unchanged, resistances of the anode connection lines can be reduced, and under a condition that the resistances of the anode connection lines remain unchanged, the width of the anode connection line is reduced.

On the other hand, because the anode connection lines in the display substrate provided by the embodiments of the present disclosure are routed along the third direction D, the anode connection lines can also avoid interference or diffraction with structures (such as various signal lines) extending along the first direction X or the second direction Y on the display substrate, in turn, the mura defects can be avoided, and the display quality can be improved. That is, in the display substrate provided by the embodiments of the present disclosure, by forming the N anode connection holes along the third direction D to form a plurality of anode connection hole rows, not only can a larger second display region (that is, a transparent display region) be realized, but also the resistance of the anode connection line is reduced electrically, and mura and other defects are avoided optically, and unexpected technical effects are achieved.

In some examples, as illustrated by FIG. 3, each of the anode connection lines 170 includes a first sub-connection line 171, the first sub-connection line 171 is located between two adjacent anode connection hole rows 165 and extends along the third direction D. In this way, the display substrate can be routed between two adjacent anode connection rows in the second display region.

In some examples, as illustrated by FIG. 3, at least six first sub-connection lines 171 are arranged between two adjacent anode connection hole rows 165. In this way, the display device can realize a second display region with a larger diameter.

In some examples, as illustrated by FIG. 3, the plurality of anode connection holes 160 in each of the anode connection hole rows 165 are located on a virtual straight line extending along the third direction D. It should be noted that because the anode connection holes have a certain size, the above-mentioned "the plurality of anode connection holes in each of anode connection hole rows are located on a virtual straight line extending along the third direction D" includes a case where centers of orthographic projections of a plurality of anode connection holes in each of the anode connection hole rows on the base substrate are located on a virtual straight line extending along the third direction D, also includes a case where the orthographic projections of the plurality of anode connection holes in each of the anode connection hole rows on the base substrate are overlapped with the virtual straight line extending along the third direction D.

In some examples, a value range of the included angle between the third direction D and the first direction X is from 30 degrees to 60 degrees. In this way, the sizes of the light-emitting structures or the sub-pixels electrically connected with the anode connection lines are relatively large in the third direction D, so that the diameter of the formed second display region is also relatively large.

For example, the included angle between the third direction D and the first direction X may be 30 degrees, 40 degrees, 45 degrees, 50 degrees or 60 degrees.

In some examples, as illustrated by FIG. 3, the M first connection holes 151 and the N second connection holes 152 form a plurality of connection hole rows 155 along the fourth direction Z, a plurality of first connection holes 151 and at least one second connection hole 152 in each of the connection hole rows 155 are arranged along a fourth direction Z, the plurality of connection hole rows 155 are arranged along a direction perpendicular to the fourth direction Z, and an included angle between the fourth direction Z and the first direction X is less than 90 degrees.

In the display device provided in this example, the anode connection lines may also be routed between two adjacent connection hole rows in the first display region, that is, the anode connection lines may be routed obliquely. In this way, the display substrate can further reduce the lengths of the anode connection lines while realizing a larger second display region, in this way, under a condition that the widths of the anode connection lines remain unchanged, the resistance of the anode connection lines can be reduced, and under a condition that the resistances of the anode connection lines remain unchanged, the widths of the anode connection lines are reduced. On the other hand, because the anode connection lines in the display substrate provided by the embodiments of the present disclosure are routed along the fourth direction Z in the first display region, the anode connection lines can also avoid interference or diffraction with structures (such as various signal lines) extending along the first direction X or the second direction Y on the display substrate, thus the mura defects can be avoided, and the display quality can be improved.

In some examples, as illustrated by FIG. 3, each of the anode connection lines 170 includes a second sub-connection line 172, the second sub-connection line 172 is electrically connected with the first sub-connection line 171, the second sub-connection line 172 is located between two adjacent connection hole rows 155, and extends along the fourth direction Z. In this way, the display substrate can be routed between two connection hole rows in the first display region. It should be noted that the above-mentioned "the first sub-connection line is electrically connected with the second sub-connection line" includes a case where the first sub-connection line is directly electrically connected with the second sub-connection line, and also includes a case where the first sub-connection line is electrically connected through other conductive lines.

In some examples, as illustrated by FIG. 3, at least six second sub-connection lines 172 are arranged between two adjacent connection hole rows 155.

In some examples, as illustrated by FIG. 3, the included angle between the third direction D and the first direction X is greater than an included angle between the fourth direction Z and the first direction X.

In some examples, as illustrated by FIG. 3, a value range of the included angle between the fourth direction Z and the first direction X is from 15 degrees to 30 degrees. In this way, the display substrate can better avoid the interference or diffraction phenomenon between the anode connection lines and the structures extending along the first direction X or the second direction Y on the display substrate, in turn, the mura defects can be avoided, and the display quality can be improved.

In some examples, the included angle between the fourth direction Z and the first direction X may be 22 degrees, 22.5 degrees or 23 degrees.

It should be noted that the above-mentioned "the first sub-connection line is electrically connected with the second sub-connection line" includes a case where the first sub-connection line is directly electrically connected with the second sub-connection line, and also includes a case where the first sub-connection line is electrically connected with other conductive lines.

In some examples, as illustrated by FIGS. 4A to 4C, the first display region 100A further includes M first light-emitting structures 210, each of the M first light-emitting structures 210 includes a first anode 211, the M first anodes 211 of the M first light-emitting structures 210 are electrically connected with the output ends of the M first pixel driving circuits 121 through the M first connection holes 151. In this way, the first pixel driving circuits 121 and the first light-emitting structures 210 electrically connected with each other can form first sub-pixels 200A for display. It should be noted that the above-mentioned first anodes are driving electrodes of the first light-emitting structures.

In some examples, as illustrated by FIGS. 4A to 4C, the first pixel driving circuits 121 and the first light-emitting structures 210 electrically connected with each other can be stacked in the direction perpendicular to the base substrate 110; that is, orthographic projections of the first pixel driving circuits 121 on the base substrate 110 are overlapped with orthographic projections of the first light-emitting structures 210 on the base substrate 110.

In some examples, as illustrated by FIGS. 4A to 4C, the second display region 100B further includes N second light-emitting structures 220, each of the N second light-emitting structures 220 includes a second anode 221, the N second anodes 221 of the N second light-emitting structures 220 are electrically connected with the output ends of the N second pixel driving circuits 122 through the N anode connection holes 160, the N anode connection lines 170 and the N second connection holes 152. In this way, the second pixel driving circuits 122 and the second light-emitting structures 220 electrically connected with each other can form second sub-pixels 200B for display. It should be noted that the above-mentioned second anodes are driving electrodes of the second light-emitting structures.

In some examples, as illustrated by FIGS. 4A to 4C, each of the first light emitting structures 210 includes a first light emitting functional layer 212 and a first cathode 213, the first light-emitting functional layer 212 is located on a side of the first anode 211 away from the base substrate 110, the first cathode 213 is located on a side of the first light-emitting functional layer 212 away from the first anode 211, each of the second light emitting structures 220 includes a second light emitting functional layer 222 and a second cathode 223, the second light-emitting functional layer 222 is located on a side of the second anode 221 away from the base substrate 110, the second cathode 223 is located on a side of the second light-emitting functional layer 222 away from the second anode 221. It should be noted that the above-mentioned "light emitting functional layer" may include a film layer directly used for emitting light, and may also include a functional layer used for assisting emitting light, such as an electron injection layer, an electron transport layer, a hole injection layer and a hole transport layer.

In some examples, a material of the first light-emitting functional layer 212 includes an organic light-emitting material, and a material of the above-mentioned second light-emitting functional layer 222 includes an organic light-emitting material. Of course, the embodiments of the present disclosure include but are not limited thereto, and the above-mentioned first light-emitting functional layer and the second light-emitting functional layer may also use other light-emitting materials.

In some examples, the above-mentioned second light-emitting structures 220 are all transparent light-emitting structures. That is, light can at least partially pass through the above-mentioned second light emitting structures 220. For example, the second anodes 221 and the second cathodes 223 of the second light emitting structures 220 can be made of transparent conductive oxide material, such as indium tin oxide material.

In some examples, the above-mentioned output ends may be output ends of driving signals of the pixel driving circuits; for example, in a case that the above-mentioned pixel driving circuits include transistors and capacitors, the output ends may be the source or drain electrodes of the light-emitting control transistors.

In some examples, material of the base substrate 110 may be a glass substrate, a quartz substrate, a plastic substrate, a silicon substrate or a polyimide substrate. Of course, the embodiments of the present disclosure include but are not limited thereto, and the above-mentioned base substrate may also use other types of substrates. In addition, in a case that a silicon substrate is used as the base substrate, at least part of the semiconductor structures in the above-mentioned pixel driving circuit may be located in the base substrate.

In some examples, as illustrated by FIGS. 4A to 4C, the display substrate 100 further includes a pixel driving layer 120 and a plurality of planarization layers 130; the pixel driving layer 120 is located on the base substrate 110; the plurality of planarization layers 130 are located on a side of the pixel driving layer 120 away from the base substrate 110. The first pixel driving circuits 121 and the second pixel driving circuits 122 are located in the pixel driving layer 120, the first connection holes 151 and the second connection holes 152 at least penetrate through one of the planarization layers 130 closest to the pixel driving layer 120 among the plurality of planarization layers 130.

In some examples, as illustrated by FIGS. 4A to 4C, different first connection holes 151 may pass through different planarization layers 130; and the planarization layers 130 which different second connection holes 152 penetrate through may also be different.

In some examples, as illustrated by FIGS. 4A to 4C, the display substrate 100 further includes at least one conductive layer 140 among the plurality of planarization layers 130, and the N anode connection lines 170 are located on the at least one conductive layer 140.

In some examples, as illustrated by FIGS. 4A to 4C, the at least one conductive layer 140 includes a plurality of conductive layers 140, the plurality of conductive layers 140 are sequentially arranged along a direction perpendicular to the base substrate 110, each of the conductive layers 140 is sandwiched between two adjacent planar layers 130; a part of the N anode connection lines 170 is located in one conductive layer 140 among the plurality of conductive layers 140, another part of the N anode connection lines 170 is located in another conductive layer 140 of the plurality of conductive layers 140.

In some examples, as illustrated by FIGS. 4A to 4C, the display substrate 100 may include four planarization layers 130 and three conductive layers 140; the four planarization layers 130 include a first planarization layer 131, a second planarization layer 132, a third planarization layer 133 and a fourth planarization layer 134 arranged in sequence along the direction perpendicular to the base substrate 110; the three conductive layers 140 include a first conductive layer 141, a second conductive layer 142 and a third conductive layer 143 arranged in sequence along the direction perpendicular to the base substrate 110. A first part of the N anode connection lines 170 is located on the first conductive layer 141, a second part of the N anode connection lines 170 is located on the second conductive layer 142, and a third part of the N anode connection lines 170 is located on the third conductive layer 143. It should be noted that FIG. 4A to FIG. 4C respectively show three situations in which the second pixel driving circuits 122 are electrically connected with different light-emitting structures 220 through different anode connection lines 170, it can be seen that different anode connection lines 170 are located on different conductive layers 140.

In some examples, in order to avoid adverse effects of the anode connection lines on the display, the material of the conductive layer is transparent conductive oxide, such as indium tin oxide (ITO).

In some examples, as illustrated by FIGS. 4A to 4C, the orthographic projections of the second pixel driving circuits 122 on the base substrate 110 may be overlapped with the orthographic projections of the first light emitting structure 210 on the base substrate 110, so that areas on the second pixel driving circuits 122 are used for light-emitting display.

In some examples, as illustrated by FIG. 3, the shapes of the orthographic projections of the second display region 100B on the base substrate 110 are circles. Of course, the embodiments of the present disclosure include but are not limited thereto, and the shapes of the orthographic projections of the second display region 100B on the base substrate 110 may also be other shapes.

In some examples, as illustrated by FIG. 3, the first display region 100A is arranged on one side of the second display region 100B in the first direction X.

Figure 5:
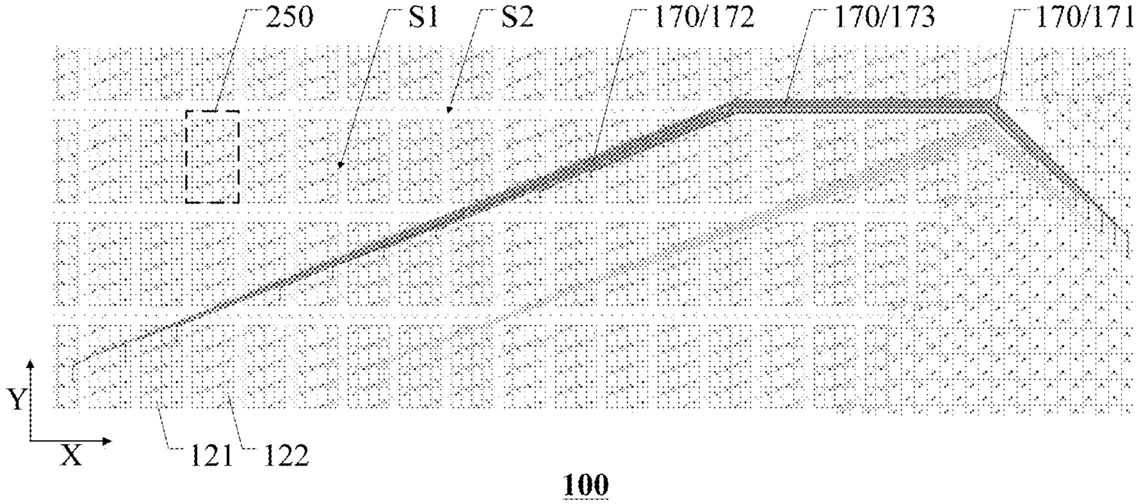
FIG. 5 is a planar schematic diagram of another display substrate provided by an embodiment of the present disclosure.

FIG. 5 is a planar schematic diagram of another display substrate provided by an embodiment of the present disclosure. As illustrated by FIG. 5, the first display region 110A includes a plurality of sub-driving regions 250 arranged in an array along the first direction X and the second direction Y, a first spacer S1 is provided between two adjacent sub-driving regions 250 in the first direction X, a second spacer S2 is provided between two adjacent sub-driving regions 250 in the second direction Y, each of the anode connection lines 170 includes a second sub-connection line 173, and the third sub-connection line 173 is electrically connected with the second sub-connection line 172, and is located in the first spacer S1 or the second spacer S2. In this way, the display substrate can use the first spacer or the second spacer for routing.

In some examples, each of sub-driving regions 250 includes a plurality of first pixel driving circuits 121 and a plurality of second pixel driving circuits 122, a size of the first spacer S1 in the first direction X is greater than a distance between adjacent first pixel driving circuits 121 in the sub-driving region 250, and a size of the second spacer region S2 in the second direction Y is greater than a distance between adjacent first pixel driving circuits 121 in the sub-driving region 250.

Figure 6:
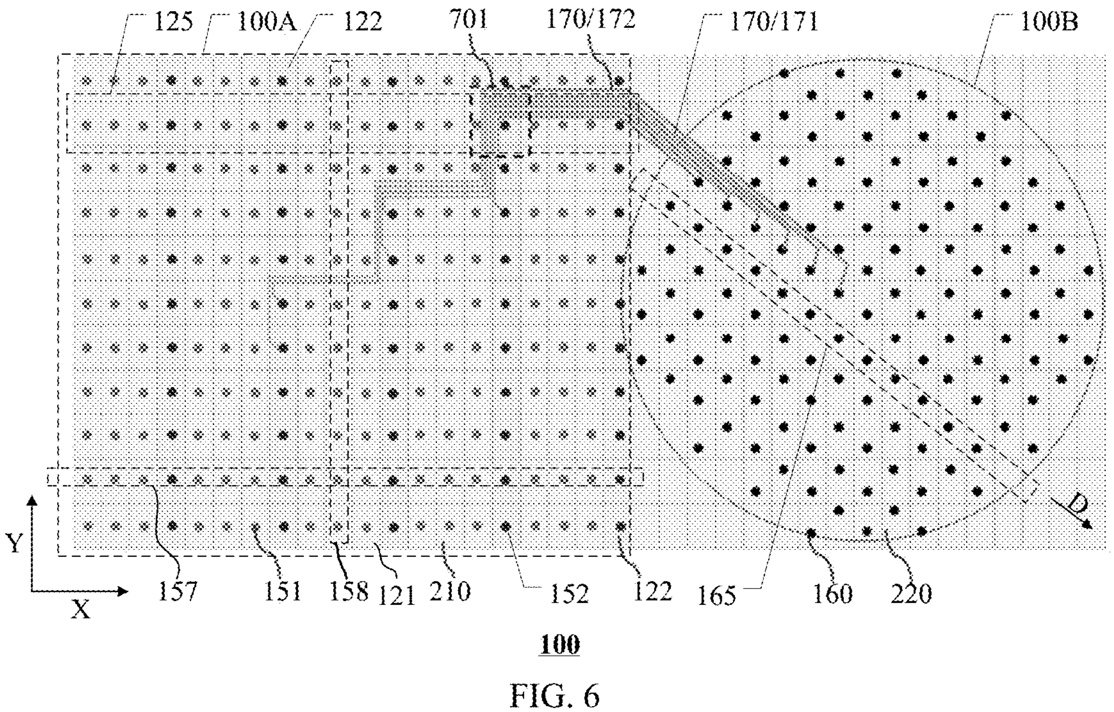
FIG. 6 is a planar schematic diagram of another display substrate provided by an embodiment of the present disclosure.

FIG. 6 is a planar schematic diagram of another display substrate provided by an embodiment of the present disclosure. As illustrated by FIG. 6, the display substrate 100 includes a base substrate 110 and a first display region 100A and a second display region 100B located on the base substrate 110; the first display region 100A includes M first pixel driving circuits 121, M first connection holes 151, N second pixel driving circuits 122, and N second connection holes 152; the second display region 100B includes N anode connection holes 160. At this time, the display substrate 100 further includes N anode connection lines 170 electrically connecting the N second connection holes 152 and the N anode connection holes 160. The second display region 100B is configured to allow light to pass through, that is, the second display region 100B is a transparent display region. The M first connection holes 151 are arranged in one-to-one correspondence with the M first pixel driving circuits 121, each of the first connection holes 151 is configured to be electrically connected with an output end of the corresponding first pixel driving circuit 151, the N second connection holes 152 are arranged in one-to-one correspondence with the N second pixel driving circuits 122, each of the second connection holes 152 is configured to be electrically connected with the output end of the corresponding second pixel driving circuit 122; the M first pixel driving circuits 121 and the N second pixel driving circuits 122 are arrayed on the base substrate 110, and form pixel driving rows 125 extending along the first direction X, and a plurality of pixel driving rows 125 are arranged along the second direction Y. Both M and N mentioned above are positive integers greater than or equal to 2.

As illustrated by FIG. 6, the M first connection holes 151 and the N second connection holes 152 form a plurality of connection hole rows 157 and a plurality of connection hole columns 158 along the first direction X and the second direction Y. The N anode connection holes 160 form a plurality of anode connection hole rows 165 along the third direction D, a plurality of anode connection holes 160 in each of the anode connection hole rows 165 are arranged along the third direction D, a plurality of anode connection hole rows 165 are arranged along a direction perpendicular to the third direction D, and an included angle between the third direction D and the first direction X is less than 90 degrees. It should be noted that the included angle between the third direction D and the first direction X is less than 90 degrees refers to that the third direction D is a direction inclined by a certain angle relative to the first direction X or the second direction Y, that is, an oblique direction.

In the display substrate, in the second display region, the N anode connection holes form a plurality of anode connection hole rows along the third direction D, thus in the display substrate, the anode connection lines can be routed between adjacent anode connection hole rows. In this case, the light-emitting structures or sub-pixels connected with the anode connection lines between adjacent anode connection hole rows are arranged along the third direction D, however, a size of a single light emitting structure or sub-pixel in the third direction D is significantly larger than a size of a light emitting structure or sub-pixel in the first direction X. Thus, in the case of a certain number of anode connection lines between adjacent anode connection hole rows, a diameter of the second display region formed by routing the anode connection lines along the third direction D (oblique direction) is significantly larger than a diameter of the second display region formed by routing the anode connection lines along the first direction X. Therefore, the display substrate forms a plurality of rows of anode connection holes along the third direction D with N anode connection holes, and the anode connection lines can be routed between adjacent anode connection hole rows, so that the diameter of the second display region can be increased to increase the area of the second display region.

In addition, in the second display region, if the anode connection lines are routed in a ladder shape, the light emitting structures or sub-pixels electrically connected with these anode connection lines can also be arranged along an oblique direction to a certain extent. However, this routing method will greatly increase the lengths of the anode connection lines, and the routing method are more complicated. Therefore, the display substrate provided by the embodiments of the present disclosure can also form a plurality of anode connection hole rows by forming N anode connection holes along the third direction D, thus the anode connection lines can be routed along the third direction D without step-shaped routing, so that the lengths of the anode connection lines can be reduced, in this way, under a case where the widths of the anode connection lines remain unchanged, the resistance of the anode connection lines can be reduced, and under a case where the resistances of the anode connection lines remains unchanged, the widths of the anode connection lines are reduced.

On the other hand, because the anode connection lines in the display substrate provided by the embodiments of the present disclosure are routed along the third direction D, the anode connection lines can also avoid interference or diffraction with structures (such as various signal lines) extending along the first direction X or the second direction Y on the display substrate, in turn, the mura defects can be avoided, and the display quality can be improved. That is, by forming the N anode connection holes along the third direction D into a plurality of anode connection hole rows, the display substrate provided by the embodiments of the present disclosure can not only realize a larger second display region (that is, a transparent display region), but also electrically reduce the resistances of the anode connection lines, so that the defects such as mura are optically avoided, and unexpected technical effects are achieved.

In some examples, as illustrated by FIG. 6, in the first display region 100A, in the display substrate 100, the anode connection lines 170 can be routed among the connection hole rows 157 and the connection hole columns 158, so that a portion having a stepped shape is formed; because the anode connection lines 170 have a stepped portion in the first display region 100A, their lengths are relatively long. Moreover, as shown by a dotted line box 701 in FIG. 6, a distance between adjacent connection hole columns 158 is small, which further limits the number of anode connection lines. Therefore, the display substrate shown in FIG. 3 forms connection hole rows extending along the fourth direction Z in the first display region, thus the anode connection lines can be routed along the fourth direction Z, without step-shaped routing, so that the lengths of the anode connection lines can be reduced, in this way, under the case where the widths of the anode connection lines remain unchanged, the resistances of the anode connection lines can be reduced, and under the case where the resistances of the anode connection lines are unchanged, the widths of the anode connection lines are reduced.

In some examples, as illustrated by FIG. 6, in the second display region 100B, each of the anode connection lines 170 includes a first sub-connection line 171, the first sub-connection line 171 is located between two adjacent anode connection hole rows 165, and extends along the third direction D. In the first display region 100A, each of the anode connection lines 170 includes a second sub-connection line 172, the second sub-connection line 172 is located between the connection hole row 157 and the connection hole column 158 that are adjacent.

Figure 7:
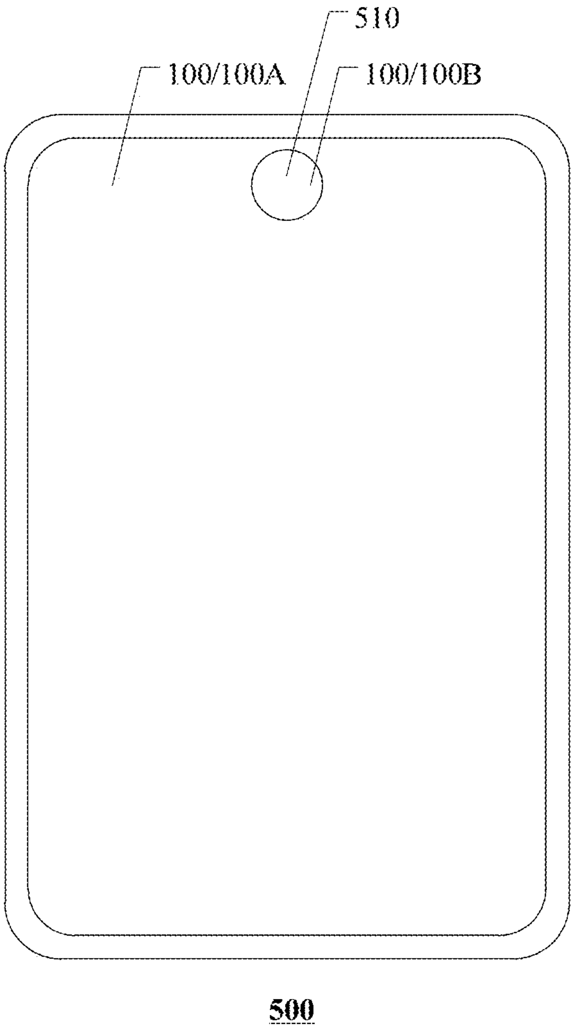
FIG. 7 is a schematic diagram of a display device provided by an embodiment of the present disclosure.

An embodiment of the present disclosure further provides a display device. FIG. 7 is a schematic diagram of a display device provided by an embodiment of the present disclosure. As illustrated by FIG. 7, the display device 500 includes any one of the display substrates 100 provided by the above examples. In this way, the display device can increase the diameter of the transparent display region, and can increase the area of the second display region; in addition, the display device can also reduce the lengths of the anode connection lines, in this way, under the case that the widths of the anode connection lines remain unchanged, the resistances of the anode connection lines can be reduced, and under the case that the resistances of the anode connection lines remain unchanged, the widths of the anode connection lines are reduced. On the other hand, the display device also avoids mura defects, and improves display quality. It should be noted that, for specific beneficial effects of the display device, reference may be made to the relevant description of the display substrate, which will not be repeated herein.

In some examples, as illustrated by FIG. 7, the display device 500 further includes a photosensitive device 510, such as a camera, and the photosensitive device 510 is located in the second display region 100B. In this way, the display device can be arranged with a photosensitive device in the second display region, thereby achieving a larger screen ratio while integrating the photosensitive device.

In some examples, the display device 500 may be an electronic product with a display function such as a smart phone, a tablet computer, a navigator, a monitor, and a television.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other.

The above is only the specific embodiment of this disclosure, but the protection scope of the present disclosure is not limited thereto. Any person familiar with the technical field can easily think of changes or substitutions within the technical scope disclosed in the present disclosure, and they should be included in the protection scope of the present disclosure. Therefore, the scope of protection of the present disclosure should be based on the scope of protection of the claims.

The invention claimed is:

1. A display substrate, comprising:

a base substrate;

a first display region, located on the base substrate, and comprising M first pixel driving circuits, M first connection holes, N second pixel driving circuits, and N second connection holes;

a second display region, located on the base substrate, and comprising N anode connection holes; and N anode connection lines, connecting the N second connection holes with the N anode connection holes, wherein the second display region is configured to allow light to pass through, the M first connection holes are arranged in one-to-one correspondence with the M first pixel driving circuits, each of the first connection holes is configured to be electrically connected to an output end of a corresponding first pixel driving circuit, the N second connection holes are arranged in one-to-one correspondence with the N second pixel driving circuits, each of the second connection holes is configured to be electrically connected to an output end of a corresponding second pixel driving circuit;

the M first pixel driving circuits and the N second pixel driving circuits are arranged in an array on the base substrate, and form pixel driving rows extending along a first direction, a plurality of pixel driving rows are arranged along a second direction intersecting with the first direction;

the N anode connection lines extend from the first display region to the second display region, the N anode connection holes form a plurality of anode connection hole rows along a third direction, a plurality of the anode connection holes in each of the anode connection hole rows are arranged along the third direction, the plurality of the anode connection hole rows are arranged along a direction perpendicular to the third direction, an included angle between the third direction and the first direction is less than 90 degrees, and both M and N are positive integers greater than or equal to 2.

2. The display substrate according to claim 1, wherein a plurality of the anode connection holes in each of the anode connection hole rows are located on a virtual straight line extending along the third direction.

3. The display substrate according to claim 1, wherein a value range of an included angle between the third direction and the first direction is from 30 degrees to 60 degrees.

4. The display substrate according to claim 1, wherein each of the anode connection lines comprises a first sub-connection line, the first sub-connection line is located between two adjacent ones of the anode connection hole rows, and extends along the third direction.

5. The display substrate according to claim 4, wherein at least 6 of the first sub-connection lines are arranged between the two adjacent ones of the anode connection hole rows.

6. The display substrate according to claim 4, wherein the M first connection holes and the N second connection holes form a plurality of connection hole rows along a fourth direction, a plurality of first connection holes and at least one of the second connection holes in each of the connection hole rows are arranged along the fourth direction, the plurality of connection hole rows are arranged along a direction perpendicular to the fourth direction, an included angle between the fourth direction and the first direction is less than 90 degrees.

7. The display substrate according to claim 6, wherein the plurality of first connection holes and the at least one of the second connection holes in each of the connection hole rows are located on a virtual straight line extending along the fourth direction.

8. The display substrate according to claim 6, wherein the included angle between the third direction and the first direction is greater than the included angle between the fourth direction and the first direction.

9. The display substrate according to claim 6, wherein a value range of the included angle between the fourth direction and the first direction is from 15 degrees to 30 degrees.

10. The display substrate according to claim 6, wherein each of the anode connection lines comprises a second sub-connection line, the second sub-connection line is electrically connected with the first sub-connection line, the second sub-connection line is located between two adjacent ones of the connection hole rows, and extends along the fourth direction.

11. The display substrate according to claim 10, wherein at least 6 of the second sub-connection lines are arranged between two adjacent ones of the connection hole rows.

12. The display substrate according to claim 6, wherein the first display region comprises a plurality of sub-driving regions arranged in an array along the first direction and the second direction, a first spacer is provided between two adjacent sub-driving regions in the first direction, and a second spacer is provided between two adjacent sub-driving regions in the second direction, each of the anode connection lines comprises a third sub-connection line, the third sub-connection line is electrically connected with the first sub-connection line, and is located in the first spacer or the second spacer.

13. The display substrate according to claim 12, wherein each of the sub-driving regions comprises a plurality of first pixel driving circuits and a plurality of second pixel driving circuits, a size of the first spacer in the first direction is greater than a distance between adjacent first pixel driving circuits in the sub-driving region, a size of the second spacer in the second direction is greater than a distance between adjacent first pixel driving circuits in the sub-driving region.

14. The display substrate according to claim 1, further comprising:

a pixel driving layer, located on the base substrate; and a plurality of planarization layers, located on a side of the pixel driving layer away from the base substrate, wherein the first pixel driving circuits and the second pixel driving circuits are located in the pixel driving layer, the first connection holes and the second connection holes at least penetrate through one of the plurality of planarization layers that is closest to the pixel driving layer.

15. The display substrate according to claim 14, further comprising:

at least one conductive layer between the plurality of the planarization layers, wherein the N anode connection lines are located in the at least one conductive layer.

16. The display substrate according to claim 15, wherein the at least one conductive layer comprises a plurality of the conductive layers, the plurality of the conductive layers are sequentially arranged along a direction perpendicular to the base substrate, each of the conductive layers is sandwiched between two of the planarization layers adjacent to each other;

a part of the N anode connection lines is located in one conductive layer of the plurality of the conductive layers, and another part of the N anode connection lines is located in another one conductive layer of the plurality of the conductive layers.

17. The display substrate according to claim 15, wherein a material of a conductive layer comprises transparent conductive oxide.

18. The display substrate according to claim 1, wherein the first display region further comprises M first light-emitting structures, each of the first light-emitting structures comprises a first anode, the M first anodes of the M first light-emitting structures are electrically connected with output ends of the M first pixel driving circuits through the M first connection holes; and the second display region further comprises N second light-emitting structures, each of the second light-emitting structures comprises a second anode, the N second anodes of the N second light-emitting structures are electrically connected with output ends of the N second pixel driving circuits through the N anode connection holes, the N anode connection lines and the N second connection holes.

19. The display substrate according to claim 18, wherein each of the first light-emitting structures comprises a first light-emitting functional layer and a first cathode, the first light-emitting functional layer is located on a side of the first anode away from the base substrate, the first cathode is located on a side of the first light-emitting functional layer away from the first anode, each of the second light-emitting structures comprises a second light-emitting functional layer and a second cathode, the second light-emitting functional layer is located on a side of the second anode away from the base substrate, and the second cathode is located on a side of the second light-emitting functional layer away from the second anode.

20. A display device, comprising the display substrate according to claim 1.

* * * * *